United States Patent
Tamamori et al.

(10) Patent No.: US 7,782,918 B2
(45) Date of Patent: Aug. 24, 2010

(54) LASER APPARATUS AND PRODUCTION METHOD OF LASER APPARATUS

(75) Inventors: Kenji Tamamori, Ebina (JP); Shinan Wang, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 12/206,086

(22) Filed: Sep. 8, 2008

(65) Prior Publication Data

US 2009/0052486 A1 Feb. 26, 2009

Related U.S. Application Data

(62) Division of application No. 11/686,075, filed on Mar. 14, 2007, now Pat. No. 7,477,668.

(30) Foreign Application Priority Data

Mar. 17, 2006 (JP) .............................. 2006-074942

(51) Int. Cl.
*H01S 5/00* (2006.01)
(52) U.S. Cl. .............................. 372/43.01; 372/46.016; 372/54
(58) Field of Classification Search .............. 372/43.01, 372/46.016
See application file for complete search history.

(56) References Cited

U.S. PATENT DOCUMENTS

| 5,335,240 | A | 8/1994 | Ho et al. |
| 5,612,229 | A | 3/1997 | Yoshida |
| 2006/0078736 | A1 | 4/2006 | Fukazawa et al. |
| 2006/0157716 | A1 | 7/2006 | Sugitatsu et al. |
| 2010/0085684 | A1* | 4/2010 | Suh et al. ................ 361/503 |

FOREIGN PATENT DOCUMENTS

JP 2001-257425 9/2001

* cited by examiner

*Primary Examiner*—Dung T Nguyen
(74) *Attorney, Agent, or Firm*—Fitzpatrick, Cella, Harper & Scinto

(57) ABSTRACT

Provided are a laser apparatus into which a large current can be injected and a production method which enables easy production of the apparatus. A laser apparatus includes a light-emitting region on a substrate, and a periodic refractive index structure containing an i-type material provided at a periphery of the light-emitting region. Another laser apparatus includes a light-emitting region between a first electrode and a second electrode on a substrate, wherein at least one of the first and the second electrodes includes a periodic refractive index structure.

1 Claim, 8 Drawing Sheets

LASER APPARATUS AND PRODUCTION METHOD OF LASER APPARATUS

This application is divisional application of application Ser. No. 11/686,075, filed Mar. 14, 2007, now U.S. Pat. No. 7,477,668.

BACKGROUND OF THE INVENTION

1. Field of the Invention

The present invention relates to a laser apparatus and a production method of a laser apparatus.

2. Description of the Related Art

In general, a semiconductor laser device includes a p-type electrode, an n-type electrode, a p-type optical waveguide, an n-type optical waveguide, and an active layer.

Being provided near the active layer and made of materials different from the material constituting the active layer, the electrodes and optical waveguides act as a resonator for confining the light generated in the active layer.

By the above configuration, stimulated (or induced) emission of laser light is caused in the active layer, and the laser light is amplified in the resonator and then guided outside the device by the optical waveguides.

Moreover, there is also a configuration using a Fabry-Perot resonator in which a cleavage plane is used as a resonator.

However, since the above-mentioned resonators cannot spatially control light perfectly, further improvement is required in order to achieve such a laser device that is desired for use in optical communication and a light source for an optical disk, operates at a lower current, and has a higher output.

Therefore, recently, as an ideal laser device, attention has been focused on a photonic crystal which can control the propagation of an electromagnetic wave, in particular a light.

The photonic crystal is a structural member in which the refractive index of a constituent substance is distributed periodically and is an artificial material which can achieve novel functions only by means of structural design.

As a most remarkable feature of the photonic crystal, it has been known that a region referred to as a photonic bandgap, where a specific electromagnetic wave cannot propagate, is formed due to the difference in refractive index of the constituent material and the periodicity of the structure.

By introducing a suitable defect into a refractive index distribution in a photonic crystal, an energy level due to the defect (defect level) is formed in the photonic bandgap. This enables the photonic crystal to control an electromagnetic wave with perfect freedom. Besides, the use of the photonic crystal enables the size of a device to be reduced.

The largest advantage of using a photonic crystal as a resonator of a laser device is that since perfect spatial control of a light, which has been hitherto impossible, can be achieved, a laser light can be obtained which has an extremely small threshold value (theoretically zero) and small temperature dependencies of the output and the wavelength.

Moreover, the advantage is also in that since the radiation of light can be controlled with respect to the entire space, high electro-optical conversion efficiency can be obtained.

Although, one dimensional, two dimensional, and three dimensional photonic crystals are present, in order to achieve the above-mentioned effect to a maximum extent, the three dimensional photonic crystal is most suitable.

In other words, the three dimensional photonic crystal has a feature that the distribution of refractive index of the constituent substance has a three dimensional periodicity, and an electromagnetic wave existing at a position of a defect hardly leaks outside and is therefore most suitable for controlling the propagation of an electromagnetic wave.

A representative example of the three dimensional photonic crystal is a woodpile structure (or rod-pile structure) disclosed in U.S. Pat. No. 5,335,240.

The woodpile structure, as illustrated in FIG. 7, has a structure having a stacked stripe layers in which a plurality of rods are periodically disposed parallel to each other at a predetermined in-plane periodicity.

Specifically, the woodpile structure is configured such that each rod belonging to each stripe layer intersects perpendicularly to each rod belonging to a nearest neighbor stripe layer, and each rod belonging to each stripe layer is parallel to each other and is offset by a half of the in-plane periodicity with each rod belonging to stripe layers being apart therefrom by two layers.

The periodicity of the photonic crystal structure is an order of a half of the wavelength of an electromagnetic wave to be controlled. For example, the periodicity of a photonic crystal for visible light is about 250 nm.

In the prior art, as a semiconductor laser device using such a three dimensional photonic crystal, for example, in Japanese Patent Application Laid-Open No. 2001-257425, a semiconductor laser device having low threshold current characteristics, in which an active portion is provided in a three dimensional photonic crystal structure, and a production method thereof has been proposed. The proposed semiconductor laser device has a structure such as illustrated in FIG. 8, in which an undoped InGaAs etch stop layer 1102 is formed on the surface of a high resistance InP substrate 1101.

Moreover, on the surface of the etch stop layer 1102, a three dimensional photonic crystal structure containing an active layer 1304 is formed.

Furthermore, on the surface of the three dimensional photonic crystal structure, a p-type electrode 1105 and an n-type electrode 1106 are formed via an InGaAs contact layer.

In other words, here, on the photonic crystal structure, there are formed electrodes composed of thin films of materials different from the material of the photonic crystal structure.

SUMMARY OF THE INVENTION

However, the prior art semiconductor laser device, disclosed in Japanese Patent Application Laid-Open No. 2001-257425, has the following problems.

The prior art semiconductor laser device has a problem such that, since there are formed on the photonic crystal structure electrodes composed of thin films of materials different from the material of the photonic crystal structure, it is difficult to inject a large amount of current into the active portion.

In other words, since the material provided between the electrode and the pin junction is non-metallic material and different from the electrode material, the series resistance between the electrode and the pin junction is large.

Therefore, there is a problem that the amount of current that can be injected into the active portion is small.

Moreover, since the electrode is not transparent, there is posed a problem that when light is emitted, the electrode may cast a shadow thereof, depending on the design.

Furthermore, since a plurality of different materials are required to be stacked, the production steps become complicated.

In view of the above-mentioned problems, the present invention provides a laser apparatus into which a large amount of current can be injected.

Moreover, the present invention provides a production method of a laser apparatus which enables easy production of the apparatus.

The present invention, in order to solve the above-mentioned problems, provides a laser apparatus with the following configuration, and a production method of the laser apparatus.

The laser apparatus according to the present invention includes a light-emitting region on a substrate, and a periodic refractive index structure including an i-type material provided at a periphery of the light-emitting region.

Moreover, according to the present invention, the i-type material is i-type titanium oxide.

Moreover, according to the present invention, the periodic refractive index structure is formed of a three dimensional photonic crystal.

Moreover, according to the present invention, a layer comprising the light-emitting region and the periodic refractive index structure has an electrode of a three dimensional photonic crystal comprised of a p-type titanium oxide material on one side of an upper side and a lower side of the layer, and an electrode of a three dimensional photonic crystal comprised of an n-type titanium oxide material on the other side of the layer.

Moreover, the laser apparatus according to the present invention includes a light-emitting region between a first electrode and a second electrode on a substrate, wherein, at least one of the first and the second electrodes includes a periodic refractive index structure.

Moreover, according to the present invention, both the first and the second electrodes include a periodic refractive index structure.

Moreover, according to the present invention, one of the first and the second electrodes which is located on the side from which laser light is output by the laser has a transparency with respect to the output laser light.

Moreover, according to the present invention, a region which surrounds the light-emitting region between the first and the second electrodes is formed of an i-type three dimensional photonic crystal.

Moreover, the method of producing a laser apparatus according to the present invention, includes: forming a first layer comprising a three dimensional periodic refractive index structure; forming a second layer with a periodic structure region on the first layer; forming a recess in the second layer and forming an active portion for generating light in the recess; and forming a third layer comprising a three dimensional periodic refractive index structure on the second layer containing the active portion.

Moreover, according to the present invention, the second layer is formed of an i-type material.

Moreover, according to the present invention, the production method further includes providing a waveguide for extracting light outside, in the three dimensional periodic refractive index structure of at least one of the first and the third layers.

Moreover, according to the present invention, the three dimensional periodic refractive index structure of at least one of the first and the third layers is formed of a material which is transparent with respect to visible light.

Moreover, according to the present invention, the material which is transparent with respect to visible light comprises any one of titanium oxide ($TiO_2$), gallium nitride (GaN), zinc oxide (ZnO), and indium tin oxide (ITO) as a main component.

Moreover, according to the present invention, the active portion includes a material which generates visible laser light.

Furthermore, the present invention encompasses the following methods of producing a laser apparatus.

The present invention is a method which includes: forming a three dimensional photonic crystal structure including a material which is transparent with respect to visible light; forming a defect portion for housing an active portion for generating light; forming the active portion in the defect portion; and forming a waveguide for guiding laser light outside the photonic crystal.

Moreover, according to the present invention, the three dimensional photonic crystal structure is a woodpile structure whose periodicity is 150 nm to 500 nm.

Moreover, according to the present invention, the active portion is comprised of a material which generates visible laser light, and is a quantum dot of GaN or $TiO_2$, or a heterostructure of $TiO_2$/InGaN/$TiO_2$ or GaN/$TiO_2$/GaN.

Moreover, the present invention includes: the stacking step of forming a three dimensional photonic crystal structure; the first sub-step of forming an alignment mark comprised of a metal on a transparent substrate; the second sub-step of forming a first layer of a transparent material thin film on the substrate; the third sub-step of forming a first mask pattern using the alignment mark as a positional reference on the transparent material thin film; the fourth sub-step of forming a first layer structure of a three dimensional photonic crystal structure by processing the transparent material thin film from above the first mask pattern; the fifth sub-step including the step of forming a sacrifice layer thin film on a thin film containing the first layer structure and the step of flattening the sacrifice layer thin film until the first layer structure is exposed; the step of forming a second and subsequent layer structures of the transparent material constituting a predetermined three dimensional photonic crystal by repeating the second to the fifth sub-steps a predetermined number of times using the alignment mark as a positional reference; and the step of removing the sacrifice layers together.

Moreover, according to the present invention, the step of forming a defect portion for housing the active portion in the photonic crystal is included in the production step of the photonic crystal structure, and, in the production step, the defect is formed by processing a transparent material thin film structure at a predetermined position into a predetermined shape.

Moreover, according to the present invention, the step of forming a waveguide for guiding the laser light outside the photonic crystal is included in the production step of the photonic crystal structure, and, in the production step, the waveguide is formed by processing a transparent material thin film structure at a predetermined position into a predetermined shape.

Moreover, according to the present invention, the step of forming the active portion in the defect portion is performed by a method including chemical vapor deposition induced by a charged beam such as an electron beam and a focused ion beam, after forming the defect portion for housing the active portion.

Moreover, according to the present invention, the sub-step of forming the transparent material thin film is a step of forming a titanium oxide thin film by means of sputtering, in which by forming an insulating titanium oxide thin film by use of a high-purity titanium oxide target, and by adding a predetermined element to the high-purity titanium oxide target, the conductivity type or conductivity of the titanium oxide thin film is controlled.

Moreover, according to the present invention, the sub-step of forming a mask pattern on the transparent material thin film includes the step of applying a resist on the transparent material thin film and forming a predetermined resist pattern by means of photolithography or electron beam exposure process, or the step of previously forming a thin film such as of a metal on the transparent material thin film, then applying a resist on the formed thin film, forming a predetermined resist pattern by means of photolithography or electron beam exposure process, and then transferring the resist pattern onto the thin film such as of the metal by means of ion milling or reactive ion etching.

Moreover, according to the present invention, the sub-step of processing the transparent material thin film to form each layer structure of a three dimensional photonic crystal structure includes the step of transferring the mask pattern onto the transparent material thin film by means of reactive ion etching, and the step of removing the mask pattern.

Moreover, according to the present invention, the sub-step of forming the sacrifice layer thin film is the step of forming a thin film of a material that is easily flattened with respect to the transparent material thin film in the subsequent flattening step, in particular copper; and the sub-step of flattening the sacrifice layer thin films is, for example, the step of flattening a copper thin film by means of chemical mechanical polishing.

Moreover, according to the present invention, the sub-step of removing the sacrifice layer thin films together is a chemical etching step using an appropriate liquid etchant or gaseous etchant.

Moreover, according to the present invention, a plurality of the alignment marks are provided corresponding to the number of stack layers.

According to the present invention, a laser apparatus can be achieved which enables injection of a large current and easy production.

Further features of the present invention will become apparent from the following description of exemplary embodiments with reference to the attached drawings.

DESCRIPTION OF THE EMBODIMENTS

Hereinafter, embodiments according to the present invention will be described.

First Embodiment

First, a laser apparatus according to first Embodiment of the present invention will be described.

Figure 1:
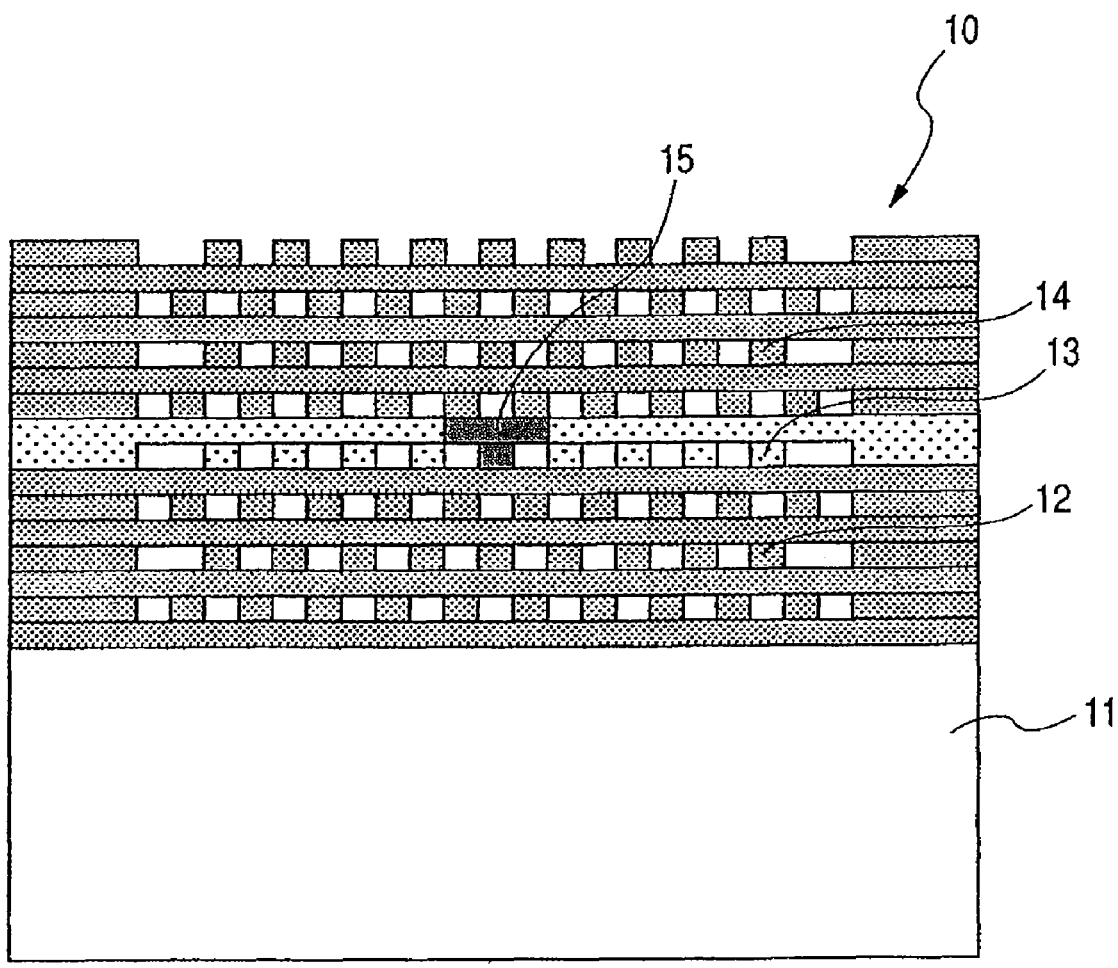
FIG. 1 is a schematic cross-sectional view illustrating the configuration of a laser apparatus according to a first Embodiment of the present invention.

FIG. 1 is a schematic cross-sectional view illustrating a configuration of a laser apparatus according to this embodiment.

In FIG. 1, a laser apparatus 10, a substrate 11, an n-type three-dimensional photonic crystal 12, an i-type three-dimensional photonic crystal 13, a p-type three-dimensional photonic crystal 14, and an active portion 15, are illustrated.

The laser apparatus 10 according to this embodiment is composed of the n-type three-dimensional photonic crystal 12, the i-type three-dimensional photonic crystal 13, the p-type three dimensional photonic crystal 14 provided on the substrate 11, the active portion 15 inserted into the i-type three-dimensional photonic crystal 13, and a waveguide (not shown).

For example, the substrate 11 is formed of synthesized quartz, and the n-type, i-type, and p-type three-dimensional photonic crystals are formed of a three-dimensional crystal composed of titanium oxide.

Moreover, the active portion 15 inserted into the i-type three-dimensional photonic crystal 13 exhibits light emission action upon the injection of an electric current.

The three-dimensional photonic crystals 12, 13 and 14 each have, for example, a woodpile structure whose periodicity is about 250 nm.

The of stacking of the n-type and p-type three-dimensional photonic crystals 12 and 14 are, for example, 12 layers, respectively, and the stacking of the i-type three-dimensional photonic crystal 13 is, for example, 2 layers.

In this embodiment, the n-type and p-type three-dimensional photonic crystals 12 and 14 are respectively used not only for an optical confinement effect, but also as electrodes for injecting current into the active portion 15.

An electric current is supplied through the electrodes of the n-type and p-type three-dimensional photonic crystals 12 and 14 to generate light in the active portion 15, and the light localized in the active portion 15 causes stimulated emission to amplify the light.

In addition, by guiding the light outside using the waveguide, a visible light laser device can be achieved.

The active portion 15 is composed of an n-type/i-type/p-type stack structure, and as for the material thereof, for example, AlGaN/GaN/AlGaN and $TiO_2$/InGaN/$TiO_2$ can be used.

Figure 2:
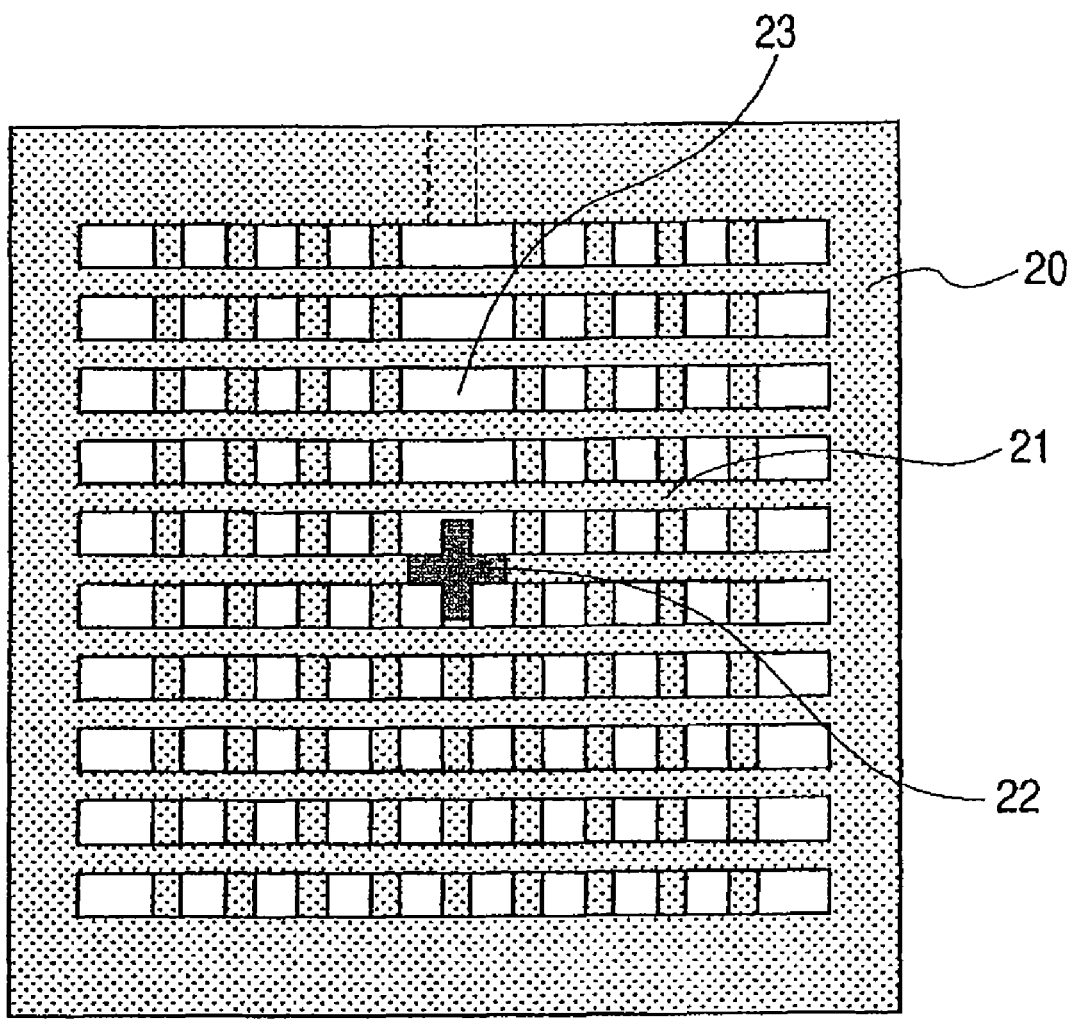
FIG. 2 is a schematic plane view illustrating a configuration example of the laser apparatus using an i-type three-dimensional photonic crystal according to the first Embodiment of the present invention.

FIG. 2 is a schematic plane view illustrating a configuration example of a laser apparatus using the i-type three dimensional photonic crystal 20.

The photonic crystal 20 is composed of a rod-structure 21 comprised of i-type titanium oxide, an active portion 22, and a waveguide 23.

The active portion 22 is provided at an intersection of the rod structures at the center of the photonic crystal 20.

Moreover, the waveguide 23 has a structure, for example, one obtained by removing one rod from the rod structure of the photonic crystal 20, and have a function of extracting light therethrough.

Although in this embodiment, the waveguide 23 is disposed in a direction parallel to the substrate plane, the waveguide 23 may be disposed in a direction perpendicular to the substrate plane.

According to the laser apparatus 10 of this embodiment, since the three-dimensional photonic crystals 12 and 14 are utilized as also n-type and p-type electrodes, respectively, to reduce the series resistance, a large current can be injected into the active portion 15.

Moreover, when the configuration of this embodiment is applied to a surface emitting device, since the electrodes are transparent and do not cast a shadow thereof during the light emission, the degree of freedom of device design can be increased.

Incidentally, the photonic crystal of the invention according to this embodiment is not necessarily required to be a three-dimensional photonic crystal, and, for example, a two-dimensional photonic crystal (with a periodicity with regard to refractive index in a plane direction) may be used.

The same also applies to the following embodiments.

Second Embodiment

Next, a laser apparatus according to second Embodiment of the present invention will be described.

Figure 3:
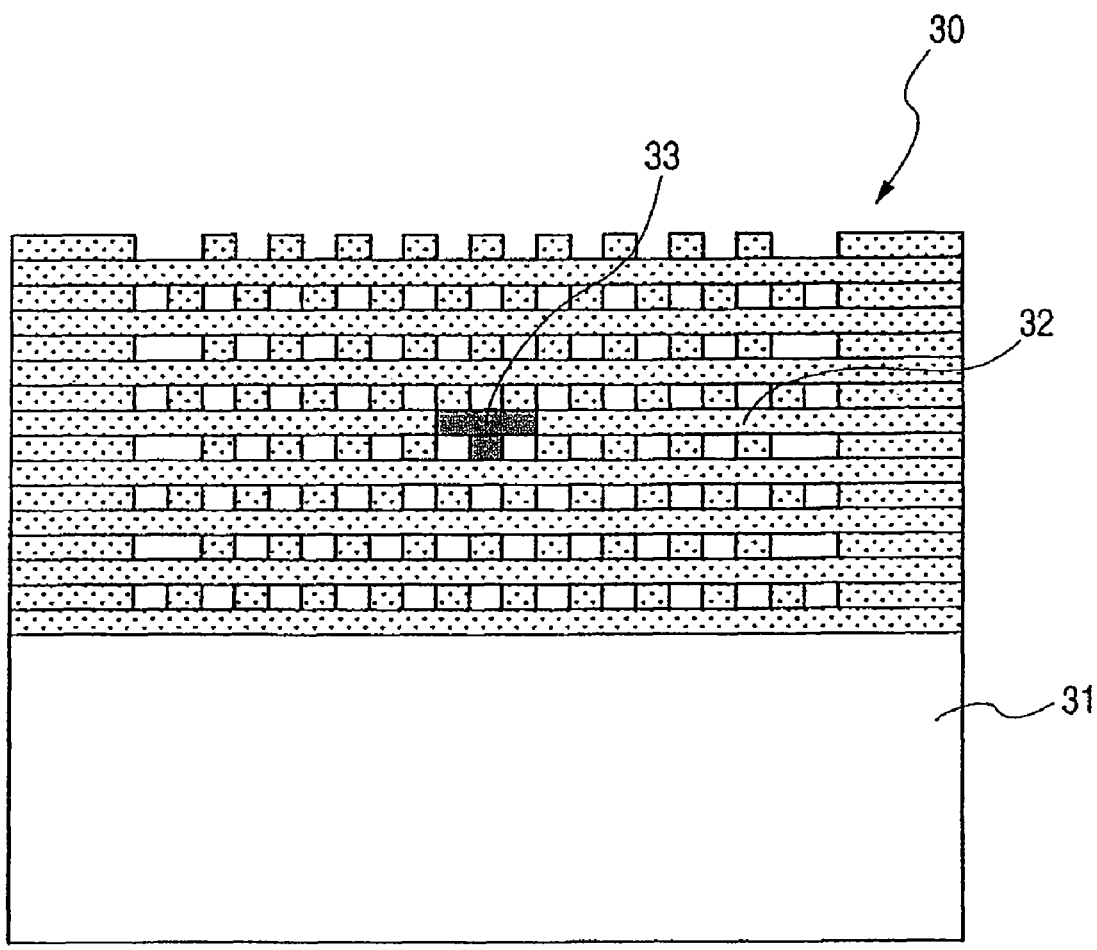
FIG. 3 is a schematic cross-sectional view illustrating the configuration of a laser apparatus according to a second Embodiment of the present invention.

FIG. 3 is a schematic cross-sectional view illustrating the configuration of the laser apparatus of this embodiment.

In FIG. 3, a laser apparatus 30, a substrate 31, an i-type three-dimensional photonic crystal 32, and an active portion 33, are illustrated.

The laser apparatus according to this embodiment is constituted by forming the three dimensional photonic crystal 32 of i-type titanium oxide on the substrate made of, for example synthesized quartz, and inserting the active portion 33 in the center of the three dimensional photonic crystal 32 which exhibits a light emission action upon irradiation with light.

The i-type three dimensional photonic crystal 32 has, for example, a woodpile structure whose periodicity is about 250 nm, and the number of stack layers is, for example, 24.

An external exciting light is injected into the active portion 33 to generate light in the active portion 33, and the light localized in the active portion 33 causes stimulated emission to amplify the light, whereby a visible light photonic crystal laser is achieved.

In FIG. 3, the active portion 33 is constituted of a quantum dot, and the material thereof is, for example, GaN.

Figure 4:
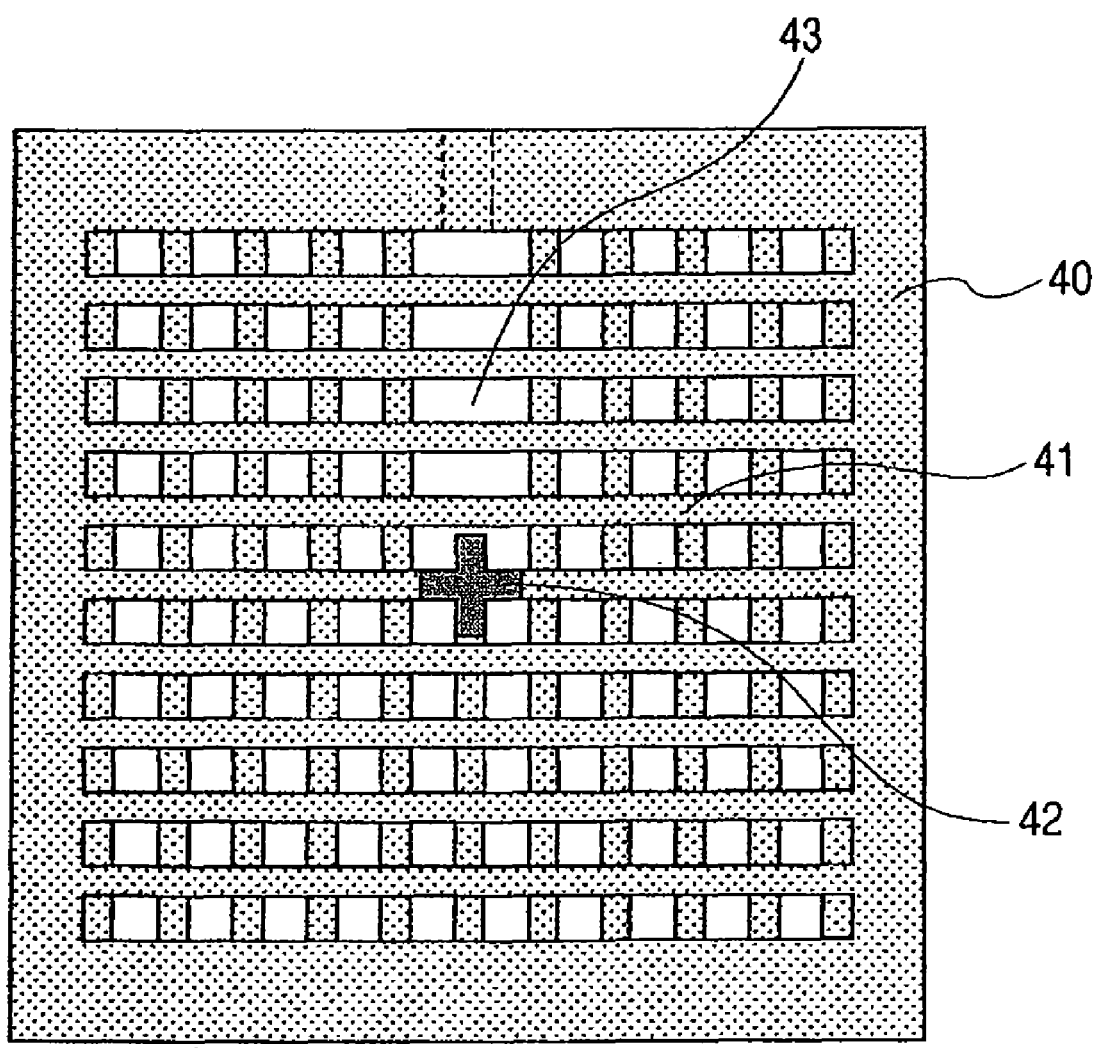
FIG. 4 is a schematic plane view illustrating a configuration example of the laser apparatus using an i-type three dimensional photonic crystal according to first Embodiment of the present invention.

FIG. 4 is a schematic plane view illustrating a configuration example of a laser apparatus using the i-type three dimensional photonic crystal 4.

The photonic crystal 40 is composed of a rod-structure 41 comprised of i-type titanium oxide, an active portion 42, and a waveguide 43.

The active portion 42 is provided at an intersection of the rod structures at the center of the photonic crystal 40.

Moreover, the waveguide 43 has a structure, for example, obtained by removing one rod from the rod structure of the photonic crystal 40, and have a function of extracting light therethrough.

Although in this embodiment, the waveguide 43 is disposed in a direction parallel to the substrate plane, the waveguide 43 may be disposed in a direction perpendicular to the substrate plane.

Third Embodiment

Next, a production method of a laser apparatus according to third Embodiment of the present invention will be described. FIGS. 5A, 5B, 5C, 5D, 5E, 5F, 5G, 5H and 5I are schematic cross-sectional views illustrating the production method of the laser apparatus according to this embodiment.

Incidentally, like elements in the figure are denoted by like reference numerals. However, the material, structure, shape, and numeral values according to the present invention, are not limited to those herein described.

In FIGS. 5A, 5B, 5C, 5D, 5E, 5F, 5G, 5H and 5I, there are shown a substrate 51, an alignment mark 52, an active portion 60, a resist pattern 54, a secondary mask pattern 55, a sacrifice layer 56, a defect portion 57 of a photonic crystal, and a transparent material thin film 53.

In addition, a first portion of the three dimensional photonic crystal 70, a second portion of the three dimensional photonic crystal 80, and a third portion of the three dimensional photonic crystal 90, are respectively illustrated. Incidentally, for convenience of description, the structure of the three dimensional photonic crystal is supposed to be a woodpile structure.

As illustrated in FIGS. 5A, 5B, 5C, 5D, 5E, 5F, 5G, 5H and 5I, the production method of a laser apparatus according to this embodiment, includes:

(1) the step of forming a three dimensional photonic crystal structure composed of a material which is transparent with respect to visible light;

(2) the step of forming a defect portion for housing an active portion for generating light;

(3) the step of forming the active portion in the defect portion; and (4) the step of forming a waveguide for guiding laser light outside the photonic crystal.

Next, the above-mentioned production method will be described in detail further.

Figure 5A:
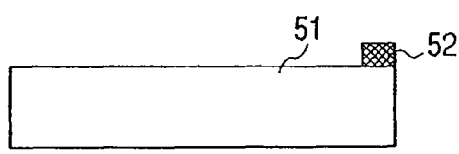
FIGS. 5A, 5B, 5C, 5D, 5E, 5F, 5G, 5H and 5I are schematic cross-sectional views illustrating a production method of a laser apparatus according to a third Embodiment and Example 1 of the present invention.

First, the step shown in FIG. 5A is a first sub-step of forming an alignment mark 52 comprised of a metal, on a transparent substrate 51.

The material of the substrate 51 is, for example, quartz or sapphire. The alignment mark 52 is a thin film pattern formed of, for example, chromium (Cr) in a thickness of 100 nm and gold (Au) in a thickness of 500 nm, viewed from the substrate side.

In the formation of the pattern, for example, an ordinary lift-off process for a metal pattern is used. The number of the alignment marks 52 is set in advance depending on the number of times of the alignment required in the subsequent steps.

For example, when 12 layers are stacked, since the number of times of aligning will be 12, the number of the alignment marks 52 is set to 12 or more.

Figure 5B:
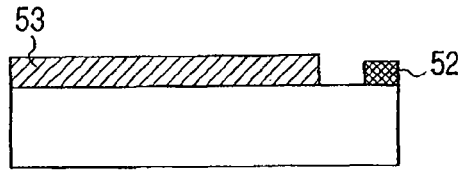

Next, the step shown in FIG. 5B is a second sub-step of forming a first transparent material thin film 53 on the substrate 51.

The material of the thin film is, for example, a material composed of, for example, titanium oxide ($TiO_2$), gallium nitride (GaN), zinc oxide (ZnO) or indium tin oxide (ITO) as a main component.

The method of deposition is, for example, a sputtering process. When the transparent material thin film 53 is deposited, the alignment mark 52 is protected in advance so that the transparent material thin film 53 is not deposited on the alignment mark 52.

As the method of protection, for example, by covering a metal mask on the alignment mark 52, the transparent material thin film 53 is deposited only on a part on which a film is to be formed. The thickness of the transparent material thin film 53 is 50 nm to 100 nm.

Figure 5C:
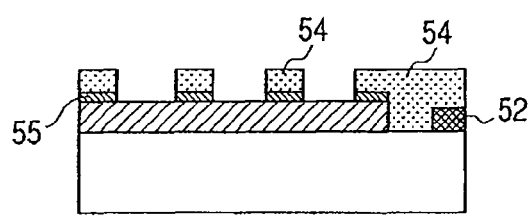

Next, the step shown in FIG. 5C is a third sub-step of forming a first mask pattern on the transparent material thin film 53 using the alignment mark 52 as a positional reference.

In the method for forming the mask pattern, for example, by applying a resist on the transparent material thin film 53, and forming a predetermined resist pattern 54 by means of a photolithography or electron beam exposure process, a mask pattern is formed.

Moreover, as needed, by previously forming a thin film such as of a metal on the transparent material thin film 53, and subsequently by applying the resist on the transparent material thin film 53, a predetermined resist pattern 54 is formed by means of a photolithography or electron beam exposure process.

After that, the resist pattern is transferred onto the thin film such as of the metal by using ion milling or reactive ion etching to form a secondary mask pattern 55.

The configuration of the metal thin film is a single layer film of, for example, chromium (Cr), platinum (Pt), or gold (Au), or a multilayer film of these metals. The thickness of the metal thin film is, for example, 10 nm to 500 nm.

The resist pattern 54 has such a shape that one layer of the woodpile three dimensional photonic crystal can be formed therein.

The period of the photonic crystal is 150 nm to 500 nm, the rod width of the woodpile is 50 nm to 250 nm, and the rod length of the woodpile is 10 μm to 500 μm. Moreover, the number of periods in the photonic crystal in a plane is 10 to 1000.

Figure 5D:
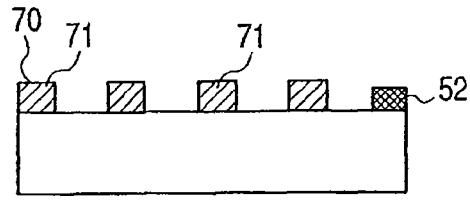

Next, the step illustrated in FIG. 5D, is a fourth sub-step of processing the transparent material thin film 53 from above the first mask pattern to form a first layer structure 71 of the three dimensional photonic crystal structure.

As a method of processing the transparent material thin film 53, first, by using the resist pattern 54 as a mask or by using both of the resist pattern 54 and the secondary mask pattern 55 as masks, the transparent material thin film 53 is processed by means of, for example, reactive ion etching.

Then, the mask patterns are removed.

In order to remove the mask patterns, there can be employed a technique of removing the resist using, for example, oxygen plasma, and dissolving the metal thin film by means of wet etching.

Figure 5E:
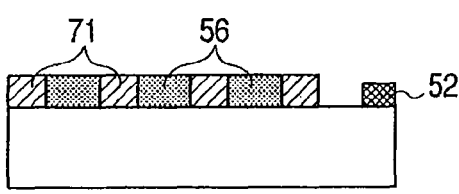

Moreover, the step shown in FIG. 5E is a fifth sub-step including the step of forming a sacrifice layer thin film 56 on a thin film containing the first layer structure 71 and the step of flattening the sacrifice layer thin film 56 until the first layer structure 71 is exposed.

The sub-step of forming the sacrifice layer thin film 56 is a step of forming a thin film of a material that is easily flattened with respect to the transparent material thin film 53, in the subsequent flattening step, preferably a copper thin film.

Moreover, the sub-step of flattening the sacrifice layer thin film 56 is a step of flattening, for example, the copper thin film by means of chemical mechanical polishing.

Figure 5F:
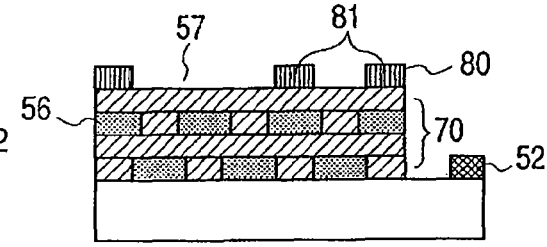

Next, the step shown in FIG. 5F is a step of forming the second and subsequent transparent material layers constituting the three dimensional photonic crystal.

Here, using the alignment mark 52 as a positional reference, by repeating the sub-steps 2 to 5 a predetermined number of times, a first portion 70 and a second portion 80 of the predetermined three dimensional photonic crystal are formed.

The predetermined number of times is, for example, 4 to 12 times. Here, in the second portion 80 of the three dimensional photonic crystal, a defect portion 57 for housing an active portion for light generating is provided.

The formation of the defect portion 57 can be achieved in a simple manner in the step of producing the photonic crystal structure by appropriately designing the shape of the structure.

Similarly, as needed, a predetermined optical waveguide is formed in a predetermined part of the first and the second portions 70 and 80.

As for the method of forming the optical waveguide, for example, there can be used a method in which a rod of the photonic crystal being in contact with the defect portion 57 is removed.

Moreover, as the main materials of the first and the second portions 70 and 80 of the three dimensional photonic crystal, a same material is used. However, as needed, in order to adjust the conductive characteristics, a predetermined impurity is added to a predetermined layer.

For example, when the material of the photonic crystal is titanium oxide, a film of titanium oxide is formed by means of sputtering, and Nb or Ta is homogeneously incorporated into a sputter target in advance.

Figure 5G:
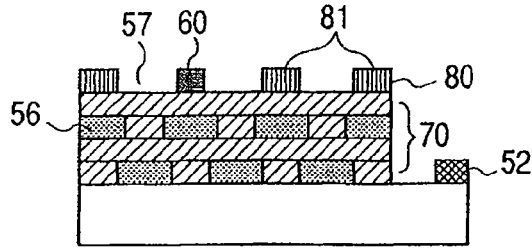

Next, the step shown in FIG. 5G, is a sub-step of forming the active portion 60 in the defect portion 57.

The formation of the active portion 60 is performed after the defect portion 57 has been formed, and by means of, for example, chemical vapor deposition induced by a charged beam such as an electron beam or a focused ion beam.

The active portion 60 is composed of a material which generates visible laser light, and is, for example, a quantum dot of GaN or $TiO_2$, or a heterostructure of $TiO_2$/InGaN/$TiO_2$ or GaN/$TiO_2$/GaN.

Figure 5H:
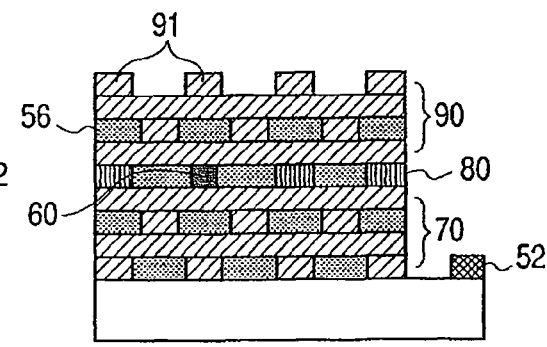

Next, the step shown in FIG. 5H is a sub-step of forming a third portion 90 of the three dimensional photonic crystal.

Here, after being subjected to the fifth sub-step, by using the alignment mark 52 as a positional reference, the sub-steps 2 to 5 are repeated at a predetermined number of times. The predetermined number of times is, for example, 4 to 12 times.

As needed, a predetermined optical waveguide is formed into a predetermined part of the third portion 90 of the three dimensional photonic crystal.

As the method for forming the optical waveguide, for example, a method can be used in which one rod of the photonic crystal being in contact with the defect portion 57 is removed.

Figure 5I:
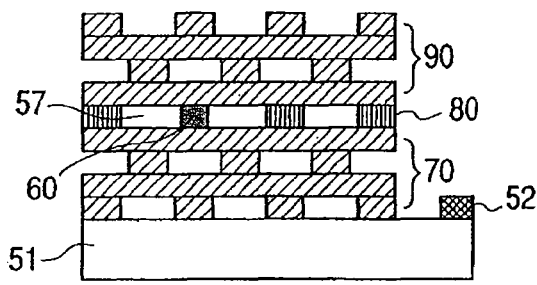

Next, the step shown in FIG. 5I, is a sub-step of removing the sacrifice layers 56 for forming the three dimensional crystal structure, together.

As the process for removing the sacrifice layers 56, for example, a chemical etching process using an appropriate liquid etchant or gaseous etchant is included.

After being subjected to the above steps, the main part of the visible laser device is produced.

EXAMPLES

Hereinafter, examples of the laser apparatus according to the present invention will be described with reference to the attached drawings.

Example 1

Now, using FIGS. 5A, 5B, 5C, 5D, 5E, 5F, 5G, 5H and 5I, Example 1 will be described. In this example, the visible laser light device is a laser device of a current injection system using a heterostructure as an active portion.

First, as illustrated in FIG. 5A, an alignment mark 52 is formed on a quartz substrate 51.

In forming the alignment mark 52, first, a resist pattern is formed on the quartz substrate 51 by means of a photolithography process.

Chromium (Cr) in a thickness of 100 nm and gold (Au) in a thickness of 500 nm are then vapor deposited on the quartz substrate 51 sequentially.

Then, the resist is dissolved using an organic solvent such as acetone to form the alignment mark 52 in a predetermined number in predetermined positions by means of a lift-off process (the step not illustrated).

Next, as illustrated in FIG. 5B, by means of sputtering, a transparent material thin film 53 made of titanium oxide ($TiO_2$) is formed on the substrate 51.

The thickness of the transparent material thin film 53 is about 90 nm. During sputtering, in order to protect the alignment mark 52, by covering the surface of the substrate 51 with a metal mask, titanium oxide is deposited only on a part of the substrate 51 on which a film is to be formed.

Moreover, for the sputtering, a $TiO_x$ (x2) target is used, but the obtained thin film is amorphous $TiO_y$ (y2).

Without heat-treating the amorphous titanium oxide film, a photonic crystal is formed as such.

As needed, after the sputtering, by heat-treating the amorphous titanium oxide thin film in an oxygen atmosphere under appropriate conditions, a crystalline titanium oxide thin film can be obtained.

As the optimum conditions of the heat treatment, the maximum temperature is 500° C. to 900° C., more preferably 600° C. to 700° C., and the retention time at the maximum temperature is 10 minutes to 10 hours, more preferably about 30 minutes.

Next, as illustrated in FIG. 5C, using the alignment mark 52 as a positional reference, a mask pattern is formed on the titanium oxide thin film 53.

Here, first, a Cr thin film is formed in a thickness of about 50 nm on the titanium oxide thin film 53, and then a resist is applied and a predetermined resist pattern 54 is formed by means of an electron beam exposure process.

Then, by means of an ion milling process, the resist pattern 54 is transferred onto the Cr thin film to form a secondary mask pattern 55.

The pattern is for forming a three dimensional woodpile photonic crystal, and the period, the width and the length of the rods are about 250 nm, about 90 nm, and about 100 μm, respectively.

Moreover, the number of the periods in plane of the woodpile rods is about 400.

Next, as illustrated in FIG. 5D, using both of the resist pattern 54 and the secondary mask pattern 55 as masks, the titanium oxide thin film 53 is processed by means of reactive ion etching.

As the reaction gas for the reactive ion etching, a fluorine containing gas, for example, $C_4F_8$, $SF_6$, or a mixed gas of $CHF_3$ and $CF_4$ can be used. After that, using oxygen plasma, the resist pattern 54 is removed, and the Cr pattern 55 is removed, by means of wet etching.

Next, as illustrated in FIG. 5E, first, on a thin film containing the first layer structure 71, a copper (Cu) thin film is deposited in a thickness of about 500 nm as a sacrifice layer 56.

Then, by means of chemical mechanical polishing (CMP), the Cu thin film 56 is flattened until the first layer structure 71 is exposed.

Next, as illustrated in FIG. 5F, using the alignment mark 52 as a positional reference, by repeating the sub-steps illustrated in FIGS. 5B, 5C, 5D and 5E eight times, the first portion 70 of the three dimensional photonic crystal and the second portion 80 of the three dimensional photonic crystal are formed. Here, the second portion 80 of the three dimensional photonic crystal is only one layer, where a defect portion 57 for housing an active portion for generating light, and an optical waveguide (not shown) are provided. The defect portion 57 and the optical waveguide (not shown) can be formed by, for example, designing the shape of a mask pattern so as to cut off a half of one rod located approximately at the center when making the layers of the second portion 80 of the photonic crystal.

Here, the main material of both of the first portion 70 and the second portion 80 of the three dimensional photonic crystal is titanium oxide.

However, in the film formation for forming the first portion 70, by incorporating Nb or Ta into a high-purity $TiO_x$ (x2) sputtering target, the titanium oxide thin film is provided with metal-like conductivity.

On the contrary, in the film formation for forming the second portion 80, using the high-purity $TiO_x$ (x2) sputtering target as such, an insulating titanium oxide thin film is formed.

Next, as illustrated in FIG. 5G, after the defect portion 57 is formed, an active portion 60 for generating light is formed in the defect portion 57.

The constitution of the active portion 60 is, for example, a heterostructure of $GaN/TiO_2/GaN$.

The formation thereof is performed by, for example, a method such as illustrated in FIGS. 6A, 6B, 6C and 6D.

Figure 6A:
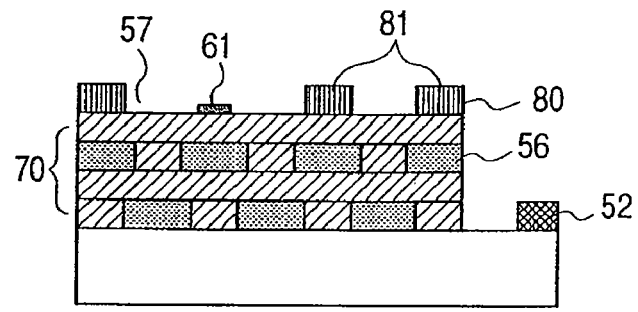
FIGS. 6A, 6B, 6C and 6D are schematic cross-sectional views illustrating a formation method of an active portion in Example 1 of the present invention.

First, as illustrated in FIG. 6A, as a first portion 61 of the active portion, a GaN thin film structure is formed in the defect portion 57 by means of chemical vapor deposition induced by irradiation with an electron beam.

The thickness and the size of the GaN thin film are set to about 30 nm and about 90 nm, respectively. After that, a focused Si-ion beam is selectively injected into the first portion 61.

Figure 6B:
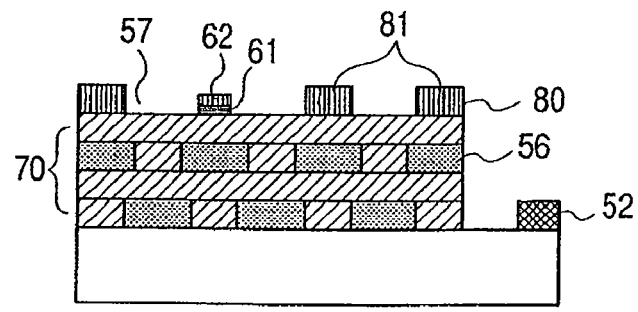

Next, as illustrated in FIG. 6B, by means of chemical vapor deposition induced by irradiation with an electron beam, a Ti thin film structure is formed on the first portion 61 of the active portion.

The thickness and the size of the Ti thin film are set to about 30 nm and about 90 nm, respectively.

Figure 6C:
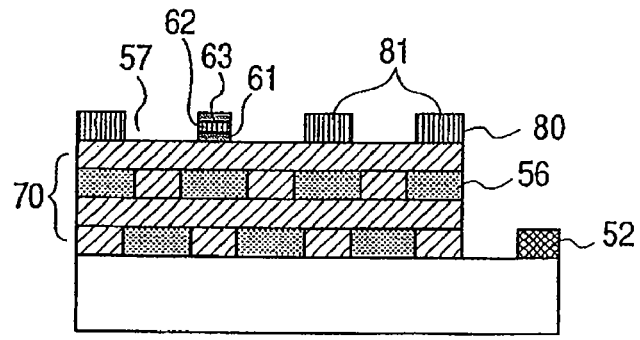

After that, the Ti thin film is oxidized in an oxygen atmosphere by means of a partial heat treatment utilizing irradiation with an electron beam or a laser, whereby a $TiO_2$ thin film is obtained as a second portion 62 of the active layer. Next, as illustrated in FIG. 6C, on the $TiO_2$ thin film to be used as the second portion 62 of the active layer, a GaN thin film structure 63 is formed by means of chemical vapor deposition induced by irradiation with an electron beam. The thickness and the size of the GaN thin film are set to about 30 nm and about 90 nm, respectively. After that, a focused Mg-ion beam is selectively injected into the first portion 61.

Finally, by means of a partial heat treatment by irradiation with an electron beam or a laser, Si and Mg respectively injected into the first portion 61 of the active portion and the third portion 63 of the active portion are activated.

Then, an n-type GaN thin film and a p-type GaN thin film are formed in the first portion 61 of the active portion and in the third portion 63 of the active portion, respectively.

Figure 6D:
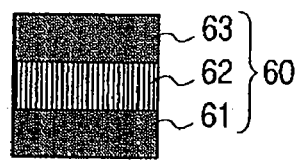
Figure 7:
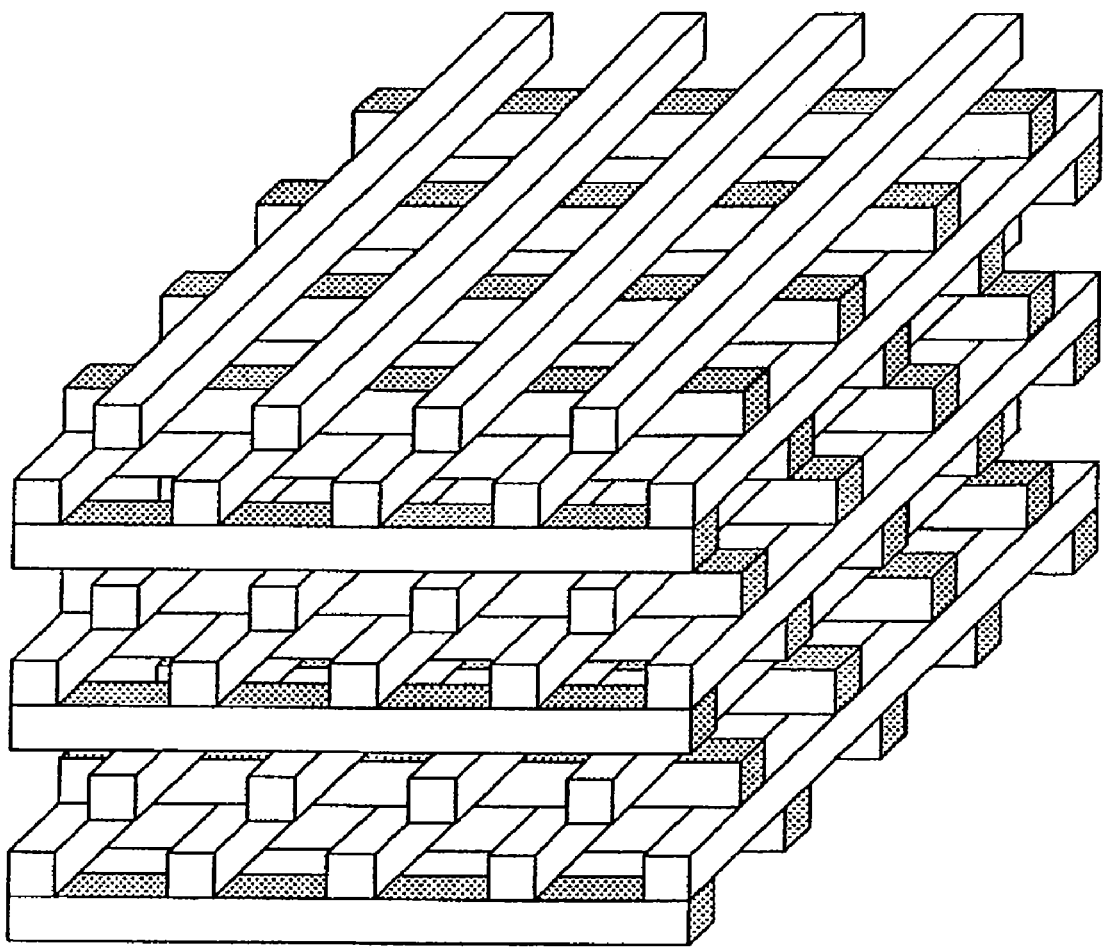
FIG. 7 is a perspective view illustrating a conventional three-dimensional photonic crystal with a woodpile structure disclosed in U.S. Pat. No. 5,335,240.
Figure 8:
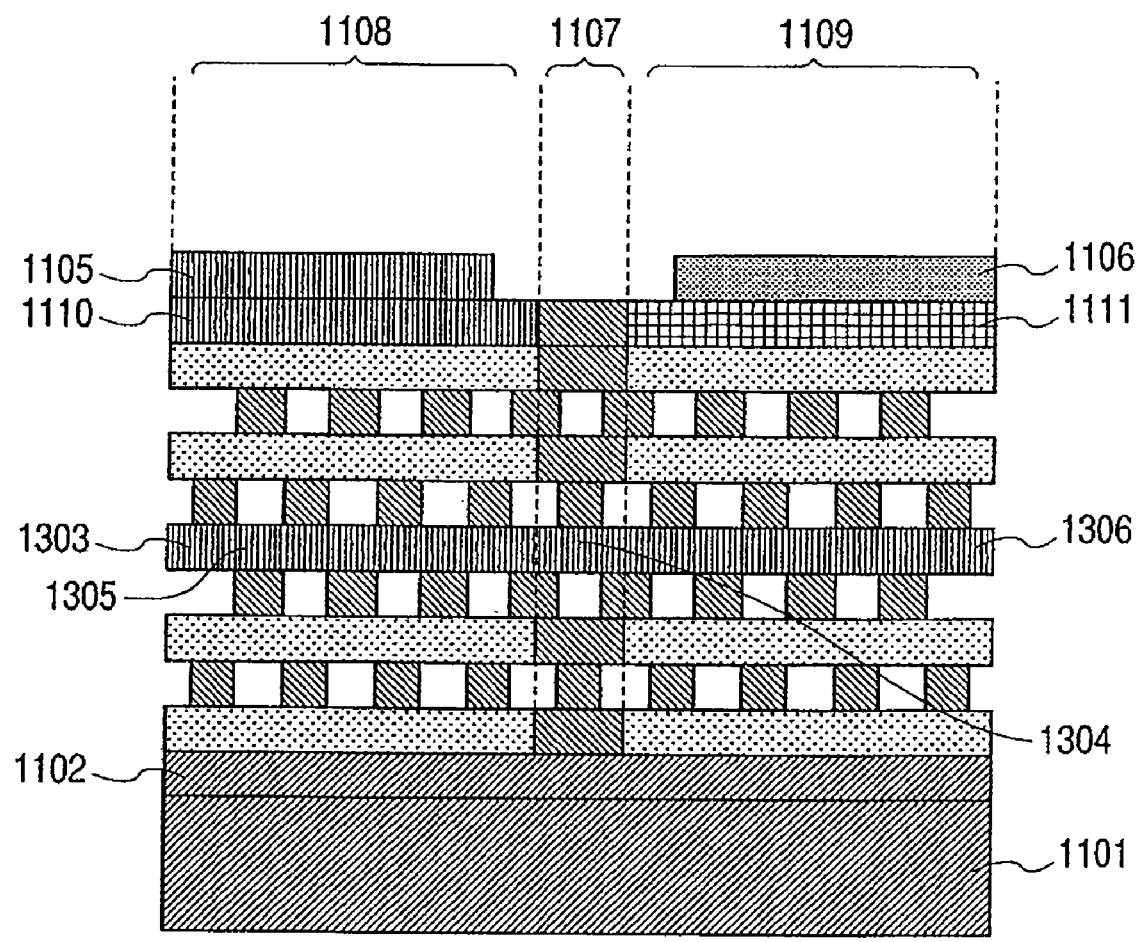
FIG. 8 is a cross-sectional view illustrating a conventional semiconductor laser device disclosed in Japanese Patent Application Laid-Open No. 2001-257425.

By performing the above-mentioned processes, in the defect portion 57 of the photonic crystal, an n-GaN/i-$TiO_2$/p-GaN heterostructure (wherein "i" means "insulating") such as illustrated in FIG. 6D is obtained.

Then, as illustrated in FIG. 5H, the third portion 90 of the three dimensional photonic crystal is formed.

First, the sub-step illustrated in FIG. 5E is performed.

Next, by repeating the sub-steps illustrated in FIGS. 5B, 5C, 5D and 5E eight times, the third portion 90 of the three dimensional photonic crystal is formed.

The structure of the third portion 90 of the three dimensional photonic crystal is substantially the same as the structure of the second portion 80 of the three dimensional photonic crystal.

Here, in the film formation for forming the third portion 90, by incorporating Nb or Ta in a high-purity $TiO_x$ (x2) sputtering target, a titanium oxide thin film is provided with metal-like conductivity.

Moreover, here, the upper part of the active portion 60 is brought into close contact with the lower part of the third portion 90 of the three dimensional photonic crystal so as to be electrically connected to each other.

Then, as illustrated in FIG. 5I, Cu that is the sacrifice layer 56 for forming a three dimensional crystal structure is dissolved using an appropriate liquid etchant to thereby be removed together.

By performing the above-mentioned steps, a visible light laser device is formed which uses the first portion 70, the second portion 80, and the third portion 90 of the three dimensional photonic crystal as the lower electrode of the active portion 60, the insulating layer, and the upper electrode of the active portion 60, respectively.

Example 2

In example 2, a production method of a laser apparatus of an optical injection system in which a visible light laser device is formed using a quantum dot as an active portion will be described.

Here, since the structure of the visible light laser light device and the production steps thereof are similar to those described with reference to FIGS. 5A, 5B, 5C, 5D, 5E, 5F, 5G, 5H and 5I, the detail will be omitted, and only significantly different parts will be described.

First, the active portion 60 of the visible light laser device in this example is a GaN quantum dot.

The quantum dot is cylindrical, and the diameter thereof is 5 nm to 50 nm, and the height is 10 nm to 90 nm. In this case, the upper part of the GaN quantum dot may be not in contact with the third portion 90 of the photonic crystal.

As the production method of the GaN quantum dot, an electron beam induced chemical vapor deposition process is used.

In addition, since the first portion 70 and the third portion 90 of the three dimensional photonic crystal of this example are not required to be used as electrodes, the materials thereof may be composed of only insulating titanium oxide.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-074942, filed Mar. 17, 2006 which is hereby incorporated by reference herein in its entirety.

What is claimed is:

1. A laser apparatus comprising a light-emitting region between a first electrode and a second electrode on a substrate,
    wherein at least one of the first and the second electrodes comprises a periodic refractive index structure, and
    wherein a region which surrounds the light-emitting region between the first and the second electrodes is formed of an i-type three dimensional photonic crystal.

* * * * *